United States Patent
Jang

(10) Patent No.: US 7,312,606 B2
(45) Date of Patent: Dec. 25, 2007

(54) METHOD FOR AUTOMATIC MEASUREMENT OF FAILURE IN SUBTHRESHOLD REGION OF METAL-OXIDE-SEMICONDUCTOR TRANSISTOR

(75) Inventor: Chang Soo Jang, Gwanak-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 47 days.

(21) Appl. No.: 11/320,682

(22) Filed: Dec. 30, 2005

(65) Prior Publication Data

US 2006/0148111 A1 Jul. 6, 2006

(30) Foreign Application Priority Data

Dec. 30, 2004 (KR) ................... 10-2004-0117533

(51) Int. Cl.
*G01R 31/28* (2006.01)
(52) U.S. Cl. ..................... 324/158.1; 702/66
(58) Field of Classification Search ............... 324/769, 324/158.1; 702/58, 64, 65, 66, 71, 189
See application file for complete search history.

(56) References Cited

U.S. PATENT DOCUMENTS 5,838,164 A * 11/1998 Chen ..................... 324/769

* cited by examiner

*Primary Examiner*—Ha Tran Nguyen
*Assistant Examiner*—Joshua Benitez
(74) *Attorney, Agent, or Firm*—Lowe Hauptman Ham & Berner LLP

(57) ABSTRACT

A method for detecting an abnormal condition of a MOS transistor in a subthreshold region. The method includes measuring a variation in a drain current with respect to a variation of a gate voltage of the MOS transistor to obtain a characteristics curve, and calculating, with reference to the obtained characteristics curve, a variation of transconductance with respect to each of the gate voltages to obtain a transconductance variable curve. The transconductance variable curve is differentiated. A number of inflection points in a curve obtained by the differentiation is determined to indicate the abnormal condition of the MOS transistor.

4 Claims, 4 Drawing Sheets

METHOD FOR AUTOMATIC MEASUREMENT OF FAILURE IN SUBTHRESHOLD REGION OF METAL-OXIDE-SEMICONDUCTOR TRANSISTOR

BACKGROUND OF THE INVENTION (a) Field of the Invention

The present invention relates to failure detection in a MOS transistor, and more specifically, to a method for automatically detecting an abnormal condition in a subthreshold region of the MOS transistor.

(b) Discussion of the Related Art

Traditionally, local oxidation of silicon (LOCOS), poly buffer LOCOS (PBL) and recessed LOCOS (R-LOCOS) techniques have been used for isolation in semiconductor integrated circuit devices. However, these techniques result in "bird's beak" shaped portions, and require complicated processing steps. Thus, these techniques are not suitable for use in highly integrated devices. Further, the LOCOS isolation results in a large step difference in the surface of active regions in which electronic circuits, including metal-oxide-semiconductor (MOS) transistors, are to be formed. Thus, a subsequent planarization process is required to alleviate the step difference.

Shallow trench isolation (STI) technology is considered a more viable isolation technique than the LOCOS, because STI does not create bird's beaks shaped portion. Thus, the STI technology results in reduced conversion differences, and occupies less area.

As shown in FIG. 1, the conventional STI fabrication techniques include forming a pad oxide on a semiconductor substrate 10, forming a pad nitride on the pad oxide, and forming a pattern layer for opening an isolation region in the substrate surface. The opened region from the pad oxide and pad nitride is anisotropically etching to form a trench 6 in the semiconductor substrate. A thermal oxide liner is formed in the trench, and the trench is filled with an insulating material, such as silicon oxide 12. During subsequent processing, the pad oxide and pad nitride layers are removed, and active regions are provided in which source and drain regions (S and D), a gate oxide layer 14, a gate electrode layer 16 and a silicide layer 18 are formed. The formation of the active regions typically involves masking, ion implantation, and cleaning steps. The cleaning steps may include cleaning before deposition of sacrificial oxide layer, and cleaning before ion implantation for well formation and threshold voltage. Since the corners of the STI define the boundaries between active and field regions, they are affected by these cleaning steps and a wet etching step for forming the sacrificial oxide layer, which typically use sulfuric acid and hydrofluoric acid solutions that may isotropically remove the top corners of STI leaving a void or "divot" 13 in the oxide fill 12, as shown in FIG. 1.

When a wet etching process is used for forming the gate oxide 14 and three or four wet etching steps are used for the formation of the active regions, the depth of the divot 13 increases. As a result, the junction depths of source and drain regions near to the divot 13 are lower than intended. The presence of divots 13 results in numerous disadvantages. For example, the divots are responsible for a so-called hump or kink phenomenon.

To detect the hump phenomenon, an operator measures the variation of drain current while varying the gate voltage of the MOS transistor to obtain a voltage-current characteristic curve, as shown in FIG. 2. By analyzing the curve, the hump phenomenon can be detected (as indicated by "A" in FIG. 2).

This conventional detection method suffers from numerous disadvantages, such as a lack of an automatic measuring algorithm for use in conventional DC measurement equipment.

SUMMARY OF THE INVENTION

To address the above-described and other problems, it is an object of the present invention to provide a method for detecting an abnormal condition of a MOS transistor in a subthreshold region. The method includes measuring a variation in a drain current with respect to a variation of a gate voltage of the MOS transistor to obtain a characteristics curve, and calculating, with reference to the obtained characteristics curve, a variation of transconductance with respect to each of the gate voltages to obtain a transconductance variable curve. The transconductance variable curve is differentiated. A number of inflection points in a curve obtained by the differentiation is determined to indicate the abnormal condition of the MOS transistor.

BRIEF DESCRIPTION OF THE DRAWINGS

The accompanying drawings, which are incorporated in and constitute a part of the specification, illustrate an embodiment of the invention, and together with the description serve to explain principles of the invention.

DETAILED DESCRIPTION OF THE INVENTION

An exemplary embodiment of the present invention is described below with reference to the accompanying drawings.

Figure 4:
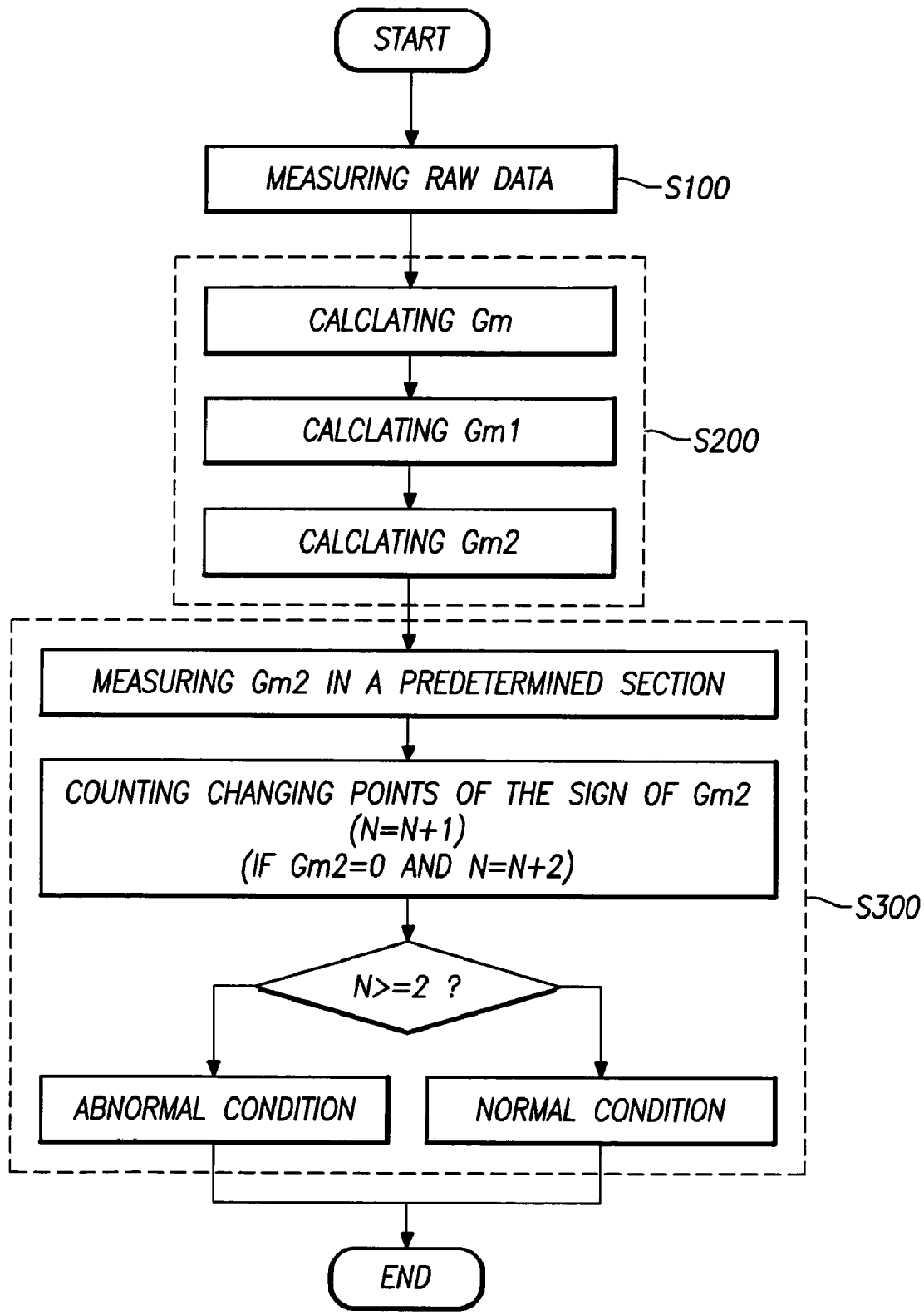
FIG. 4 is a block diagram showing a method for automatically detecting an abnormal condition occurring in a subthreshold region of a MOS transistor, according to the present invention.

FIG. 4 is a block diagram showing a method for automatically detecting an abnormal condition occurring in a subthreshold region of a MOS transistor, according to the present invention. The method includes a raw data measuring step (S100), a converting of the measured data step (S200), and a determining characteristics distortion step (S300).

In the raw data measuring step (S100), test equipment applies a bias voltage to a drain electrode of a MOS transistor (DUT: device under test). The test equipment includes one or more voltage and current meters. The bias voltage permits linear operation of the MOS transistor. Typically, 0.1V is provided to an NMOS transistor and −0.1V is provided to a PMOS transistor. Source and drain electrodes of the MOS transistor are connected to ground.

While increasing the gate bias voltage from 0V to the maximum operational voltage, current flowing to the drain electrode is measured, and constant current $V_{th}$ is measured from the measured current.

Figure 1:
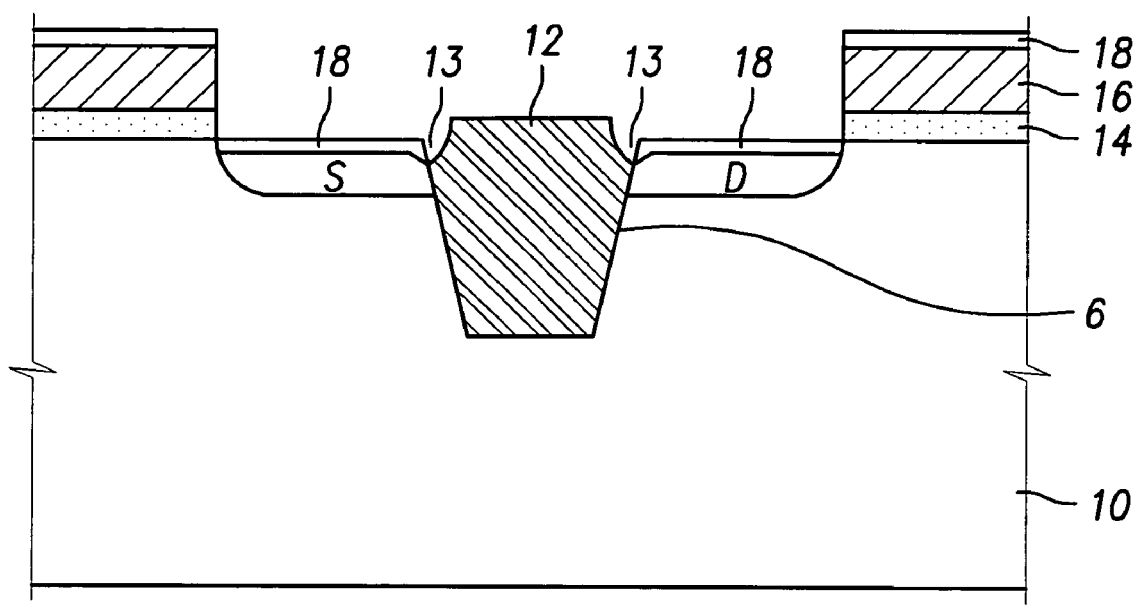
FIG. 1 is a cross-sectional view showing divots formed in the conventional STI structure.
Figure 2:
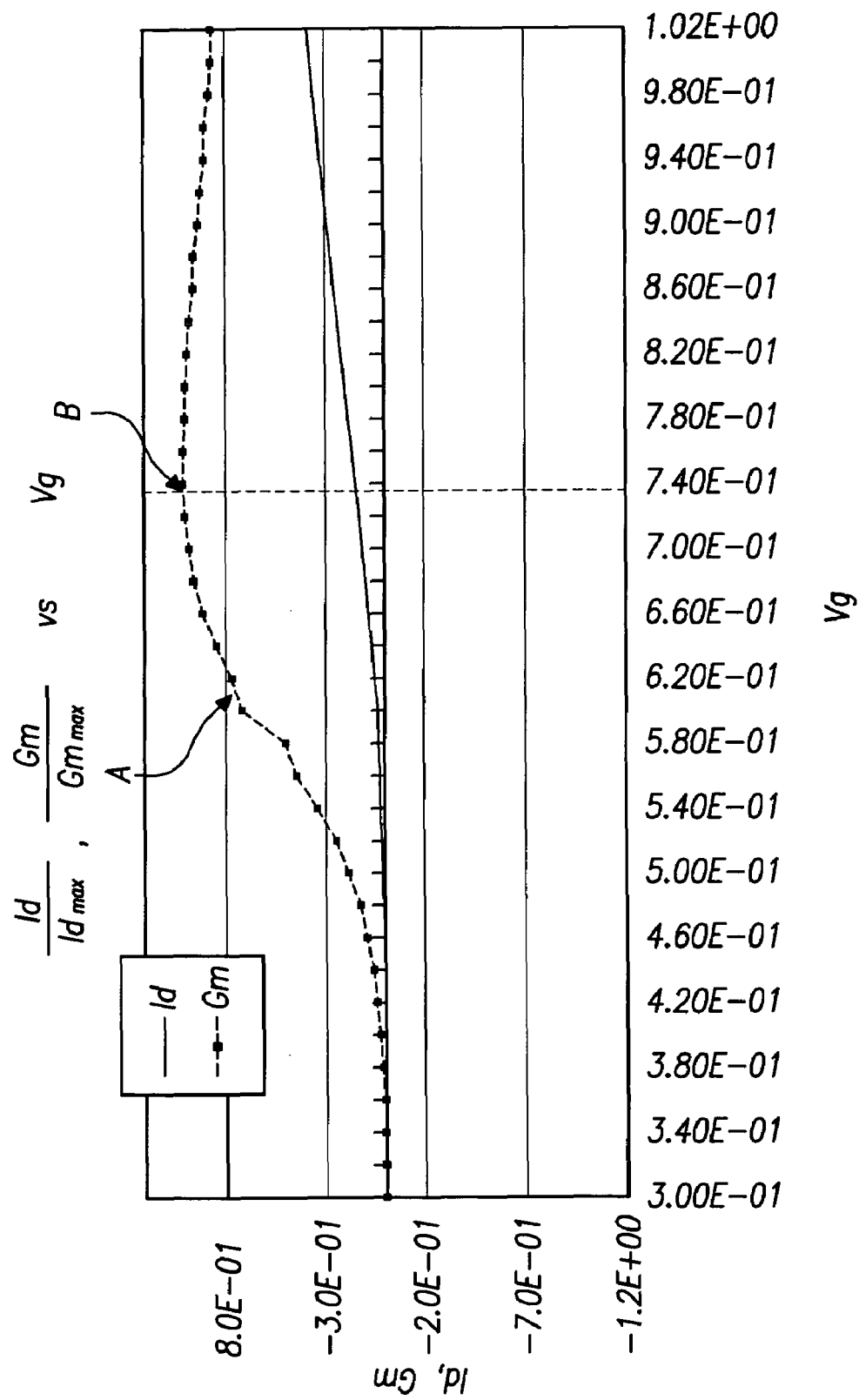
FIG. 2 is a graph showing indicating the presence of the hump phenomenon.

Examples of the measured values are shown in FIG. 2.

In the converting of the measured data step (S200), correlation data between the measured drain current and gate voltage is obtained as a displacement of drain current with respect to the gate voltage variation, and a variable Gm, which is transconductance with respect to each of the gate voltages, is calculated.

Figure 3:
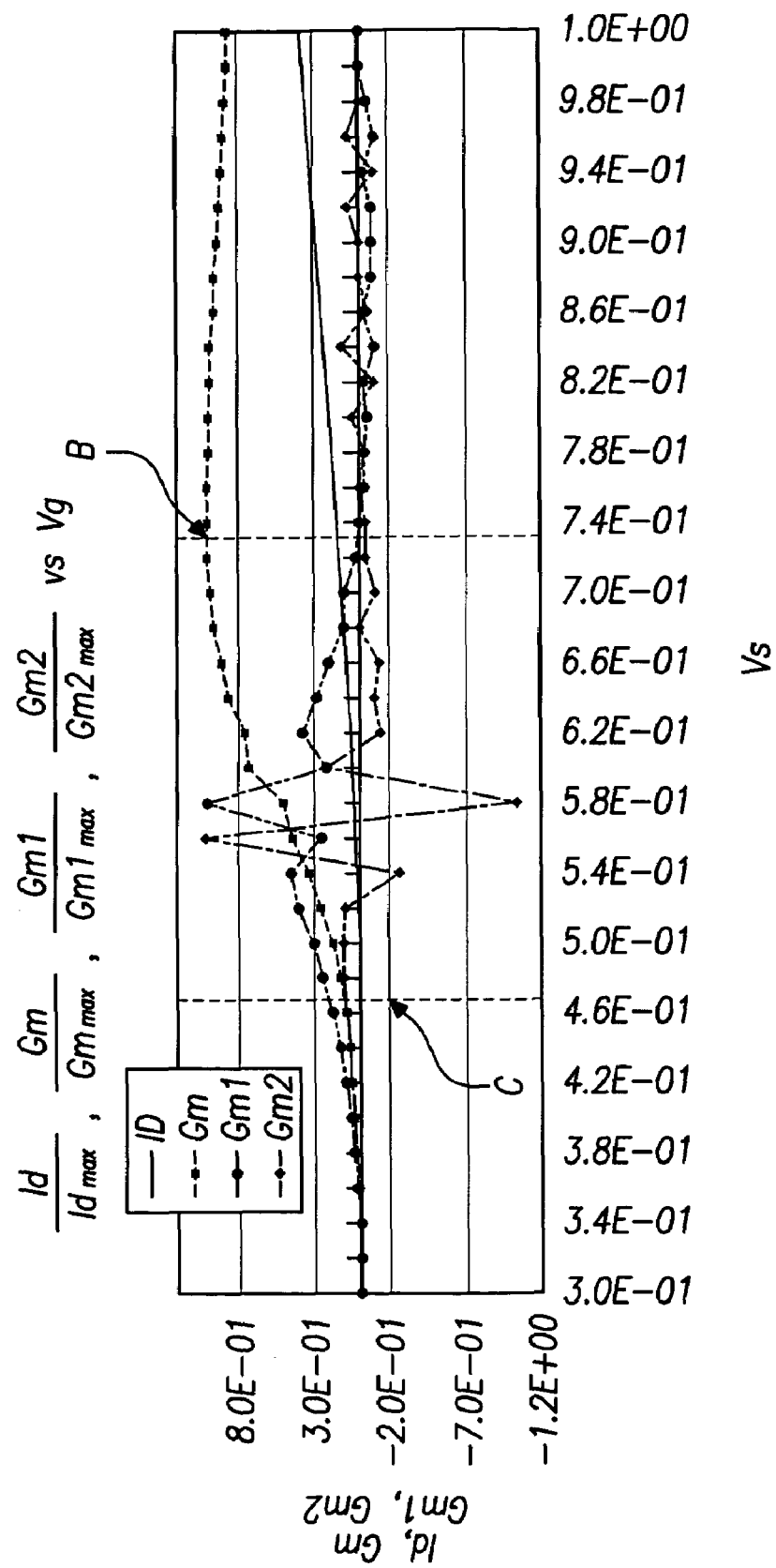
FIG. 3 is a graph obtained during a process of automatically detecting an abnormal condition that may occur in a subthreshold region of a MOS transistor according to the present invention.

The maximum value of Gm is denoted as $Gm_{max}$ and the gate voltage for the $Gm_{max}$ is denoted as $VgGm_{max}$ (indicated by "B" in FIGS. 2 and 3). The calculated Gm is differentiated with respect to the gate voltage to obtain Gm1, and Gm1 is differentiated with respect to the gate voltage to obtain Gm2.

The resulting data conversion of variable Gm, and the differentiated values Gm1 and Gm2 are shown in FIG. 3.

In the determining characteristics distortion step (S300), any distortions such as hump and kink in the transistor characteristics are determined. More specifically, a number of times that the value of Gm2, the second differentiated value, changes sign (i.e., from negative to positive, and from positive to negative, and Gm2=0) are counted between the interval of constant current $V_{th}$ measured at step (S100) (indicated by "C" in FIG. 3) and $VgGm_{max}$ obtained in step (S200) to obtain a result N. For each occurrence of Gm2=0, the value of N is increased by "2", which means that there exist two inflection points in the drain current-gate voltage characteristics curve and that the hump or kink phenomenon occurred.

The above discussion is directed to a preferred embodiment of the invention. It is to be understood, however, that the invention is not limited to the disclosed embodiment. Rather, the invention is intended to cover various modifications and equivalent arrangements included within the spirit and scope of the appended claims.

The present application claims priority to, and incorporates by reference herein in its entirety, Korean patent application no. 10-2004-0117533, filed on Dec. 30, 2004.

What is claimed is:

1. A method for detecting an abnormal condition of a MOS transistor in a subthreshold region, the method comprising:
    measuring a variation in a drain current while varying a gate voltage of the MOS transistor to obtain a characteristics curve;
    calculating, with reference to the obtained characteristics curve, a variation of transconductance with respect to each of the gate voltages to obtain a transconductance variable curve;
    differentiating the transconductance variable curve; and
    determining whether the MOS transistor has an abnormal condition or not on the basis of computing a number of inflection points in a curve obtained by the differentiation.

2. The method of claim 1, wherein the determining step comprises determining that the MOS transistor has the abnormal condition when a sign of the curve obtained by differentiating changes two times or when the curve obtained by differentiation becomes equal to zero, over a predetermined range.

3. The method of claim 1, wherein the determining step comprises:
    determining a number of times that a sign of the curve obtained by differentiating changes;
    determining a number of times that the curve obtained by differentiation becomes equal to zero, over a predetermined range;
    computing a value by adding two to the number of times that the sign changes each time the curve obtained by differentiation becomes equal to zero; and wherein
    determining that the MOS transistor has an abnormal condition is carried out when the computed value is at least two.

4. The method of claim 3, wherein the computed value equals the number of inflection points.

* * * * *